United States Patent [19]

Porter et al.

[11] Patent Number: 5,768,563
[45] Date of Patent: Jun. 16, 1998

[54] SYSTEM AND METHOD FOR ROM PROGRAM DEVELOPMENT

[75] Inventors: Jeffrey W. Porter; Anthony Overfield, both of Austin, Tex.

[73] Assignee: Dell USA, L.P., Round Rock, Tex.

[21] Appl. No.: 94,798

[22] Filed: Jul. 20, 1993

[51] Int. Cl.⁶ .................................................. G06F 9/455
[52] U.S. Cl. .................................................. 395/500
[58] Field of Search .............................. 395/500, 568; 371/16.2, 19, 21.1

[56] References Cited

U.S. PATENT DOCUMENTS

| | | | |
|---|---|---|---|
| 5,185,882 | 2/1993 | White, Jr. et al. | 395/575 |
| 5,228,039 | 7/1993 | Knoke et al. | 371/19 |
| 5,321,828 | 6/1994 | Phillps et al. | 395/500 |
| 5,325,365 | 6/1994 | Moone et al. | 371/16.2 |

*Primary Examiner*—Kevin J. Teska
*Assistant Examiner*—Ayni Mohamed

[57] ABSTRACT

Disclosed is a circuit for assisting programmers in developing programs to be loaded into read-only memories within microprocessor-based systems. The circuit acts as a ROM emulator and is powered by the target computer system, thus removing the need for an external power supply. The circuit may be reprogrammed by the target computer system even if the target computer system is not designed to allow write cycles to read-only memory. The software to be developed is stored in an electrically erasable programmable read-only memory, and may be reprogrammed either from the target computer system or through the parallel interface of a host computer system.

66 Claims, 1 Drawing Sheet

SYSTEM AND METHOD FOR ROM PROGRAM DEVELOPMENT

TECHNICAL FIELD OF THE INVENTION

The present invention relates in general to computing systems, and specifically, to a system and method for developing programs to be loaded into read-only memory ("ROM").

BACKGROUND OF THE INVENTION

Developing computer programs, whether application software, operating system software or basic input/output systems ("BIOS"), requires testing the software and making changes to correct problems or add features. Application and operating system software are usually stored on magnetic media (floppy or fixed disks) and loaded into read-write random access memory ("RAM") for testing. BIOS software, however, must be stored in a non-volatile medium such as read-only memory ("ROM") or erasable programmable read-only memory ("EPROM"). As a result, the BIOS software is more difficult to alter during development. Thus, the problem to be solved is how to write, assemble, debug and load a program into a ROM for use in a system that is being designed for implementation with microprocessors, such as a personal computer.

The prior art techniques utilized for solving the aforementioned problem involve methods that range from a simple stand-alone "burn and crash" method up to elaborate development systems and high-level language emulators.

The aforementioned prior art "burn and crash" method of code development for microprocessor-based hardware uses an assembler or compiler in a general- purpose computer (e.g., a desk top personal computer ("PC")) to generate executable code that can be burned in an EPROM. If the target processor—the one for which the code is being developed—is different from the processor in the development computer (the aforementioned PC), then a "cross-assembler" will be required to assist in generating the executable code. Otherwise, the PC's "native assembler" may be utilized.

In conjunction with the PC, the EPROM is programmed (the "burn") and then tested within the target system (the "crash"). Debugging of the code in the EPROM is then performed by observing the symptoms created by any faulty code (or faulty hardware), making corrections or inserting diagnostic tests, and repeating the process.

The disadvantage of the "burn and crash" method is that it is a slow and inconvenient procedure, reducing programmer efficiency due to wasted time and frustration. Programmers become quickly impatient with the need to cycle EPROMs through an ultraviolet eraser and ROM programmer. Moreover, the target system must be powered-off so that the EPROM may be removed for reprogramming. The ultraviolet erasing takes approximately 10 to 30 minutes, and the EPROM must be reprogrammed with a special machine or adapter, commonly requiring another 5 to 15 minutes. As a result, many programmers resort to utilizing multiple EPROMs for the development process in order to reduce the waiting time for erasing an EPROM. However, this increases cost and is inconvenient. Furthermore, the EPROM programmer apparatus is expensive.

Another prior art method for emulating a ROM uses electrically erasable programmable read-only memory ("EEPROM") instead of EPROMs. Though EEPROMs do not program any faster than EPROMs, they do relieve the task of erasing them. One disadvantage is that if invalid software is programmed into the EEPROM, the target computer system may not operate sufficiently to permit the code to be modified, requiring the EEPROM to be removed (as in an EPROM system).

Yet another drawback is that special circuitry is required on the system board (motherboard) of the target system in order to handle the reprogramming of the memory. Thus, while an EEPROM is convenient, it does add costs to the final product.

A third prior art method for emulating a ROM uses a battery backed-up (non-volatile) CMOS RAM, instead of an EPROM, during the development cycle. CMOS RAM is as fast as conventional RAM (i.e., it "programs" instantly) and has EPROM-compatible pin-outs so that it can be plugged into the target instrument carrying the trial ROM.

The main problem with using CMOS memory is that it requires a battery backup if the contents of the memory are to be maintained when the target system power is turned off. If a battery backup is not available, an extra power supply is required, which requires more cables and wires for proper implementation within the target system.

A fourth prior art method for emulating a ROM uses a "ROM-ulator". This device connects to a host computer via a parallel or serial interface and has a cable and header that plugs into a ROM (or EPROM) socket on the target system to emulate a ROM.

However, the device actually contains a dual-ported RAM, which must be downloaded from the development PC via the serial or parallel port.

The disadvantages of a "ROM-ulator" or other RAM-based emulators are that: (1) a host computer must be used to load the software into the emulator; (2) an external power supply is usually required to power the RAM and interface logic; (3) the interface to load the data is often slow (over 15 minutes with a "high-speed" serial link); and (4) the cost of the emulator is generally quite high.

Thus, there is a need in the art for a nonvolatile ROM emulator ("NVREM") that does not require an external host computer to load data.

There is also a need in the art for an NVREM that does not require an external power source, which is separate from the target system.

There is also a need in the art for an NVREM that is relatively inexpensive and easy to use without consuming a significant amount of programming time.

There is yet another need in the art for an NVREM that allows reprogramming by either the target system or a host system in case faulty code does not permit the target system to reprogram the NVREM.

SUMMARY OF THE INVENTION

These and other objectives have been achieved by an EEPROM-based ROM emulator that permits system programmers to store and modify ROM-based software (ROM or EPROM), such as the BIOS code, in a personal computer. The ROM emulator has three modes of operation: Emulate Mode, Target Reprogram Mode and Parallel Reprogram Mode. In the Emulate Mode, the target computer system being developed can read data from the EEPROM as if it were a ROM or EPROM installed within the target machine. During this Emulate Mode, a control circuit monitors signals from the target machine to determine when to change from the Emulate Mode to the Target Reprogram Mode, wherein software executing on the target computer system is able to reprogram the EEPROM. In the preferred embodiment of the present invention, the required signals, operative to change the ROM emulator from the Emulate Mode to the Target Reprogram Mode, are a predetermined sequence of addresses.

During the Target Reprogram Mode, the EEPROM is reprogrammed by the target machine via the existing address and data leads, which are in place between the processor and the ROM or EPROM socket that is coupled to the ROM emulator, in the "reverse" direction. Normally, these leads are designed to only read from the ROM or EPROM. However, the present invention reverses this "normal" mode by allowing the processor to write to the ROM emulator coupled to the ROM or EPROM socket.

Alternatively, the EEPROM may be reprogrammed through the parallel port of a host PC. This is accomplished by the control circuit monitoring signals from the PC in order to detect a signal commanding the ROM emulator to change from the Emulate Mode to the Parallel Reprogram Mode whereby the host system can reprogram the EEPROM via the parallel port. When the ROM emulator is in the Parallel Reprogram Mode, the EEPROM is isolated from the target computer system. Upon completion of the Parallel Reprogram Mode, the control circuit returns the ROM emulator to the Emulate Mode.

One technical advantage of the present invention is that it provides for a ROM emulator that may be reprogrammed in a target system not designed to allow write cycles to the ROM.

Another technical advantage of the present invention is that it provides for a ROM emulator that is able to operate without an external power supply.

Another technical advantage of the present invention is that it provides for a ROM emulator that may be reprogrammed from the target computer system or through the parallel interface of a host computer system.

Yet another technical advantage of the present invention is that it provides for a ROM emulator that can be reprogrammed faster than RAM-based emulators or EPROM.

Yet still another technical advantage of the present invention is that it provides for a ROM emulator that may be coupled to the ROM or EPROM socket within a target computer system. The ROM emulator may be placed inside of the target computer system for day-to-day BIOS development.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

In one embodiment, a circuit for providing control instructions to a processor and operative in response to memory addresses communicated from the processor to the circuit for providing specific control instructions associated with the memory addresses includes an input for receiving instructions from an instruction source, the received instructions including new control instructions for retention by the circuit. The circuit also includes control circuitry for monitoring the addresses communicated to the circuit from the processor and for monitoring the received instructions communicated from the instruction source via the input. The circuit further includes circuitry operable under control of the control circuitry and in response to receipt of a certain combination of the monitored addresses for enabling the substitution of the specific control instructions with new control instructions communicated from the processor and operable under control of the control circuitry and in response to receipt of certain of the received instructions from the input for enabling the substitution of the specific control instructions with new control instructions communicated from the instruction source via the input. In another embodiment, the circuit is a ROM emulator. In another embodiment, the circuit includes an EEPROM.

In another embodiment, a ROM emulator includes an addressable memory for storing code and a control circuit coupled to the addressable memory. The ROM emulator further includes a first interface adapted for coupling the addressable memory and the control circuit to a target processor, wherein the code is addressable by the target processor via the first interface, and a second interface adapted for coupling the addressable memory and the control circuit to a host processor. The control circuit monitors communications, from both the target and host processors so as to permit the target processor and the host processor to write to the addressable memory in order to modify the code. In another embodiment of the ROM emulator, the addressable memory is an EEPROM.

In another embodiment, a method for modifying code stored within a read/write memory includes the steps of monitoring address signals received from a target processor coupled to the memory and monitoring control signals received from an external processor coupled to the memory. The method further includes the step of directing the memory to accept write accesses from either the target processor or from the external processor when a predetermined set of control signals is monitored, the write accesses modifying the stored code. In another embodiment, the read/write memory is an EEPROM.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
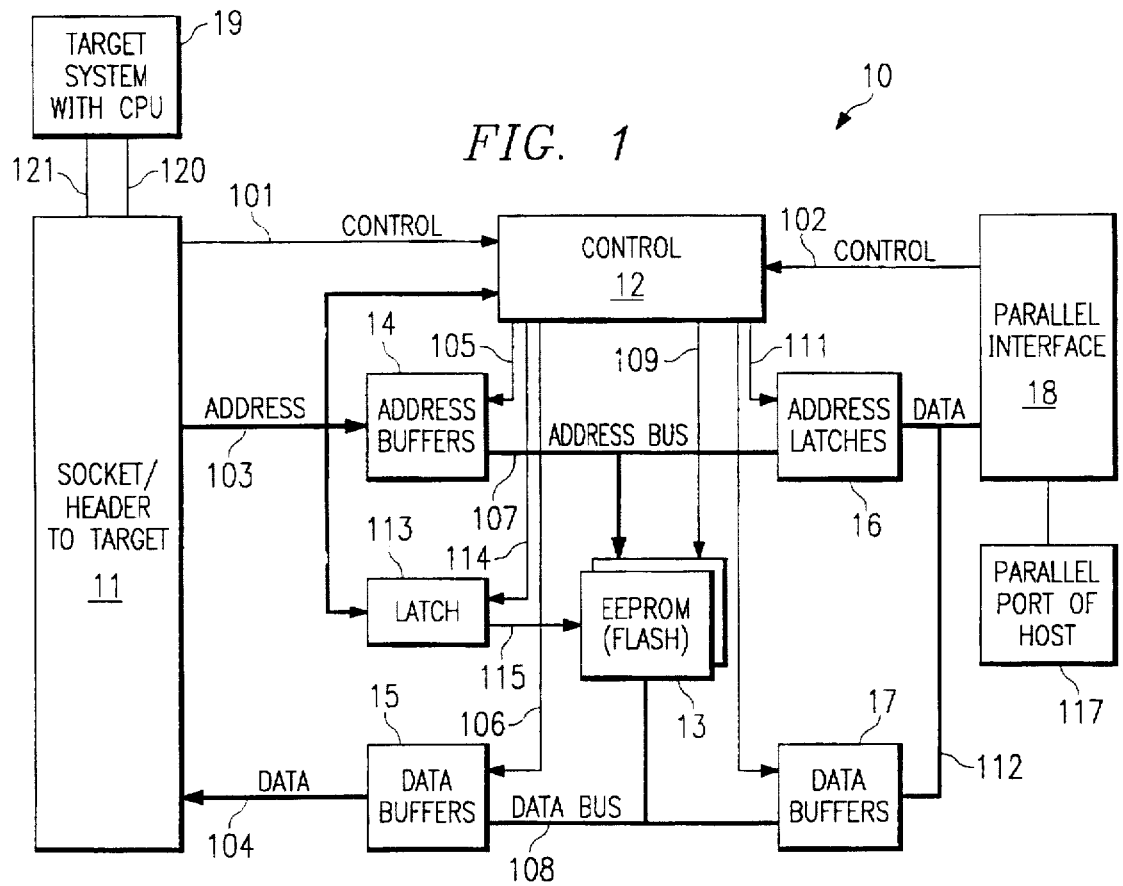
FIG. 1 illustrates a block diagram of the present invention.

Referring to FIG. 1, the operation of ROM emulator 10 will be described. ROM emulator 10 is coupled to target system 19 via socket/header connection 11 and bus 120, which is generally the location where the completed ROM (not shown) will be installed. Target system 19 may be any device utilizing a microprocessor (CPU).

In the preferred embodiment of the present invention, emulator 10 is designed to be physically installed within target system 19. ROM (or EPROM) socket 11 on target system 19 supplies power for emulator 10, and also provides for address (bus 103), control (bus 101) and data signals (bus 104) to be passed between emulator 10 and target system 19.

EEPROM 13 provides the memory for storing the ROM-based code that is being developed for target system 19. The ROM-based code may be BIOS software for target system 19. Control block 12 operates buffers 14, 15 and 17 and latches 16 and 113 and generates command signals that read and write data to EEPROM 13. Parallel interface 18 is designed to connect to the parallel printer port of a PC (not shown). Address buffers 14 and data buffers 15 isolate target system 19 from EEPROM 13 when parallel interface 18 is used to reprogram the memory within EEPROM 13. The functions of these components will be discussed in more detail below. Note that a serial input could be used in place of, or in addition to, the parallel input, if so desired.

Emulator 10 has three modes of operation. In the Emulate Mode, target system 19 is able to address and read data from EEPROM 13 as if it were a ROM or EPROM that would normally be installed within socket 11. In the Target Reprogram Mode, software executing within target system 19 (generally, under the control of a user) is able to reprogram the code within EEPROM 13. And, in the Parallel Reprogram Mode, an external host computer system, such as the aforementioned PC (not shown), is able to reprogram EEPROM 13 via parallel interface 18. These three modes will now be discussed in detail with reference to FIG. 1.

Emulate Mode

During the Emulate Mode, control 12 activates address buffers 14 via bus 105, target data buffers 15 via bus 106 and latch 113 via bus 114. Control 12 also passes selected control signals, received over bus 101 from target system 19, via bus 109 to EEPROM 13, which is emulating a ROM or EPROM.

When the data within EEPROM 13 is to be read by target system 19, target system 19 places an address on bus 103, via socket 11, and then asserts control signals on bus 101.

Figure 2:
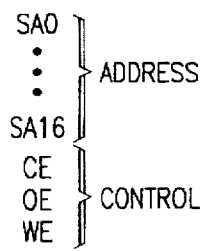
FIG. 2 illustrates address and control signals received by the present invention from a target computer system.

Referring to FIG. 2, the address and control signals produced by target system 19 are illustrated. Signals SA0 to SA16 are address bits for addressing memory within EEPROM 13. Signals CE (chip enable), OE (output enable) and WE (write enable) are control signals for controlling operation of EEPROM 13. The address signals propagate over bus 103 to address buffers 14 and over bus 107 to EEPROM 13, and the control signals pass over bus 101 to control logic 12 and on to EEPROM 13 via bus 109.

EEPROM 13 retrieves the addressed data from its memory array, places it on data bus 108, and the data then passes through data buffers 15 to data bus 104, which returns the data to target system 19 via socket 11.

While in the Emulate Mode, control 12 monitors addresses coming into address buffers 14 for an "attention" sequence of addresses.

This specified sequence of addresses determines when emulator 10 switches from the Emulate Mode to the Target Reprogram Mode. This predetermined pattern of addresses is generated by target system 19, which is under the control of the programmer.

In order to identify the predetermined sequence of addresses, control 12 utilizes a state machine within its logic circuitry that counts from zero to 7. In state zero, the state machine is looking for a particular address (e.g., address 4). And, if it sees address 4, then it advances to state 1. In state 1, it is looking for another particular address (e.g. address zero), and if it sees that address zero, it advances to state 2.

This process continues to state 7 if the proper sequence of addresses is received. If at any state, the state machine does not observe the next address within the sequence, it returns to state zero. If and when the state machine reaches state 7 and observes the final specified address within the required sequence, it then advances to the Target Reprogram Mode, otherwise it returns to state zero.

The state machine is implemented in a well-known manner using flip-flop registers for a counter, and logic circuits to perform the comparison based on the address bits and the current state, which are implemented using AND and OR gates in a programmable array logic ("PAL").

The actual sequence of address information that triggers the change to the Target Reprogram Mode can be changed by the user. The sequence can be modified permanently, or a control lead could be added to allow the change to be dynamic from either parallel port 117 or from target machine 19 as desired.

Eight states were arbitrarily chosen for the state machine, since eight states are likely to provide a very high probability that emulator 10 will not enter the Target Reprogram Mode unintentionally.

Inadvertently entering the Target Reprogram Mode is also prevented by choosing an appropriate sequence of addresses. Normally, software programs read addresses in a numerical sequence. Therefore, it is important to choose a sequence of addresses that is not numerically sequential, and in fact, in some order that a typical software program would not access.

Note within the above described embodiment that while eight sequential addresses must be obtained in the right order, emulator 10 could be designed to have a unique address which would trigger control 12 to convert to the Target Reprogram Mode. However, in such a situation that unique address then could not be used in EEPROM 13 for any other purpose, thereby reducing its memory capacity.

Additionally, during the time that control 12 is monitoring the aforementioned sequence of addresses, EEPROM 13 is still functioning in the Emulate Mode. Only after a predetermined sequence of addresses are received does control 12 then realize that a code has been programmed for which it is to respond.

Target Reprogram Mode

Figure 3:
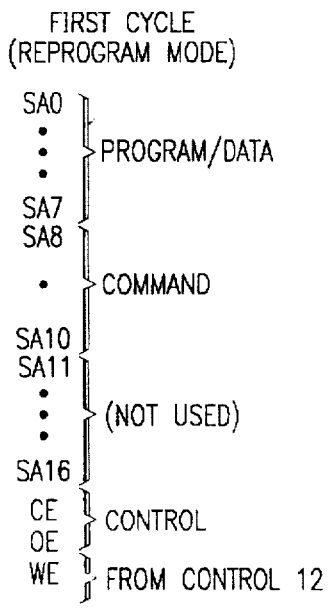
FIG. 3 illustrates address and control signals received in a first cycle after the present invention has entered into a Target Reprogram Mode.

Once emulator 10 is in the Target Reprogram Mode, control 12 monitors the received address signals, which are broken into two cycles for control purposes. As shown in FIG. 3, the first cycle uses bits SA8, SA9 and SA10 as command bits, and bits SA0 to SA7 as program data bits. These bits are held by latch 113.

Figure 4:
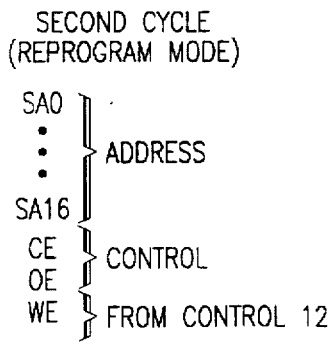
FIG. 4 illustrates address and control signals of a second cycle when the present invention has entered into the Target Reprogram Mode.

Bits SA0 to SA7, which were latched in the first cycle, are latched to become the data for the following cycle. Therefore, at the end of the first cycle, control 12 latches the lower eight bits (SA0 to SA7) of the address bus into data latch 113. Then, on the second cycle, if command bits SA8 to SA10 from the first cycle indicate that a write operation is to take place, control 12 will drive bits SA0 to SA7 out of latch 113 onto bus 115 to EEPROM 13 and also assert the appropriate WE signal to EEPROM 13. The location to which the data (held in latch 113 from the first cycle) is directed is controlled by bits SA0 to SA16 of the second cycle, as shown in FIG. 4.

With respect to FIG. 3, bits SA8 to SA10 are used by control 12 to determine whether the command within the Target Reprogram Mode is a "read data command" or a "write data command," or if control 12 is to return to the Emulate Mode. For example, if the command (bits SA8 to SA10) is 011 (binary), control 12 will execute the "write data command" with the latched data (bits SA0 to SA7). If the command is 001 (binary), control 12 will execute the "read data command". If the command is any other binary value, control 12 will return to the Emulate Mode.

When control 12 executes the "write data command," it waits for the next cycle from target system 19. The address of this second cycle is driven to EEPROM 13 along with the data that has been latched in latch 113 in the first cycle. Control 12 also activates the appropriate signals to write the data to EEPROM 13 (e.g., control 12 asserts the CE and WE signals to EEPROM 13, in the preferred embodiment). After this read-turned-into-a-write cycle, control 12 waits for another command.

When control 12 executes the "read data command," it waits for the next read cycle from target system 19. The address of this next read cycle is driven to EEPROM 13 along with read control signals (CE and OE in this embodiment). During the "read data command" cycle, control 12 does not interpret any address lines as control signals. The contents of EEPROM 13 are accessed and control 12 then waits for another command.

If the command within bits SA8 to SA10 is a "write data command," then the data which is in lower bits SA0 to SA7 is latched into latch 113, and on the second cycle, as shown in FIG. 4, the address bits SA0 to SA16 are used in the customary way to instruct control 12 as to where in EEPROM 13 the data which has already been latched is to be stored.

The well-known flash logic within EEPROM 13 contains control logic that interprets the data that is written to it as either these various commands to create or to reprogram or to verify the contents of the memory in EEPROM 13. The software running on target computer 19 is responsible for writing the proper data, erasing and reprogramming the flash memory. The bits contained in latch 113 are either a command or an instruction to the flash memory, or data to be written that the flash memory will store. This is determined by the type of flash memory used within EEPROM 13 and the type of data in latch 113 as is well-known in flash EEPROMS.

Parallel Reprogram Mode

During the previously described Emulate or Target Reprogram Modes, control 12 also monitors signals received on bus 102 from parallel interface 18, looking for an "Emulate Off" command produced by host computer 117. If the "Emulate Off" command is detected, control 12 switches to the Parallel Reprogram Mode. If an "Emulate On" command is detected on bus 102, control 12 returns emulator 10 to the Emulate Mode.

In response to the received "Emulate Off" command, control 12 implements seven parallel interface commands: Emulate On, Emulate Off, Load Low Address, Load Middle Address, Load High Address, Write Data and Read Data.

The Emulate Off command from control 12 is sent over buses 105, 106 and 114 to disable address buffers 14, data buffers 15 and latch 113, respectively, in order to isolate EEPROM 13 from target system 19. The Emulate On command from control 12 reactivates address buffers 14, data buffers 15 and latch 113 to return emulator 10 to the Emulate Mode.

The Load Low/Middle/High Address commands are sent via bus 111 to address latches 16 to latch the addresses of data bus 112 from parallel interface 18 into address latches 16. During the Write Data command, control 12 directs the outputs of address latches 16 over address bus 107 to addresses in EEPROM 13. The Write Data command also directs data buffers 17 to accept data from data bus 112 and transfers this data over data bus 108 to EEPROM 13. Concurrently, control 12 sends write signals over bus 109 to EEPROM 13 in order that it writes the received data into memory.

During the Read Data command, control 12 directs the outputs of address latches 16 to addresses in EEPROM 13 over address bus 107, and directs EEPROM 13 to send addressed data over data bus 108 through data buffers 17, data bus 112 and parallel interface 18 to host 117. This is accomplished by control 12 through read signals sent over bus 109 to EEPROM 13.

When the host PC, connected to parallel interface 18, is sending control signals to control 12 over control bus 102 and sending addresses and data over data bus 112 to data buffers 17 and address latches 16, the PC places parallel interface 18 into an output mode, i.e., the standard operating mode for parallel port 117 coupled to parallel interface 18. When the PC requires to read data from EEPROM 13, the PC changes the mode of parallel port 117 to an input mode, which is achieved by turning off the drivers (not shown) on parallel port 117 and allowing the pins (not shown) on parallel port 117 to be read instead.

Parallel port 117 is placed in the read mode by the PC by providing that the control signals and the data signals are no longer driven either high or low, but instead are left in a high impedance state. In this case, data buffers 17 and the control logic within control 12 will select logic levels on these signals. This is implemented in the preferred embodiment by pull-up and pull-down resistors (not shown) on the control leads in the control logic section.

A possible implementation of ROM emulator 10 may begin with a human programmer wishing to develop the BIOS code for a personal computing system, such as target system 19. After having been fully developed, target system 19 will communicate via bus 120 with a ROM or EPROM installed within socket 11.

But first, the programmer will utilize ROM emulator 10 within socket 11. EEPROM 13 will have been previously programmed with a trial version of the BIOS code to be developed and refined. Emulator 10 will be provided power by target system 19 via power bus 121.

When target system 19 is powered up, emulator 10 will be in the Emulate Mode, whereby target system 19 is able to address the memory within EEPROM 13 in the manner previously described.

If the programmer determines that the trial BIOS code is not adequate, he/she will use target system 19 to send a predetermined sequence of addresses to emulator 10 in order to begin reprogramming the code. This predetermined sequence of addresses will have been predesignated when the code was originally embedded within the memory of EEPROM 13.

When control 12, which is monitoring received addresses from the CPU of target system 19, monitors the correct sequence of addresses, it will convert emulator 10 into the Target Reprogram Mode. The programmer will be able to then write data to EEPROM 13 so as to modify the trial BIOS code. Additionally, the programmer will be able to read from EEPROM 13 during this Target Reprogram Mode.

When the programmer completes the reprogramming of the BIOS code, control 12 will return emulator 10 to the Emulate Mode. Thereafter, emulator 10 will again emulate the function of the ROM or EPROM.

If at any time target system 19 is unable to write to EEPROM 13, the programmer may utilize external host computer 117 to reprogram the BIOS code within EEPROM 13. Or, the programmer may decide that reprogramming of the BIOS code is easier from host computer 117. For whichever reason, the programmer will utilize the parallel printer port of host computer 117, which is coupled to parallel interface 18 of emulator 10, to send a control signal, the aforementioned "Emulate On" signal, to cause control 12 to convert emulator 10 from the Emulate Mode to the Parallel Reprogram Mode. Control 12 will deactivate address buffers 14, latch 113 and data buffers 15 to isolate EEPROM 13 from target system 19. Control 12 will also transfer control signals received from host computer 117 to EEPROM 13 in order that the programmer may reprogram the BIOS code within EEPROM 13. Upon completion of the reprogramming, the system programmer will send another control signal, the "Emulate Off" signal, to cause control 12 to return emulator 10 from the Parallel Reprogram Mode to the Emulate Mode.

An additional feature may be added to emulator 10 to allow a secondary memory device (not shown) to be included as a "boot" memory or backup in case the software loaded into the primary memory prevents target system 19 from booting. The secondary memory would be an additional EEPROM connected in parallel with EEPROM 13. The chip enable signal would be gated to either the primary or secondary memory, depending upon the setting of a jumper or position of a switch.

Emulator 10 was developed to assist BIOS engineers in developing BIOS firmware for PCs. However, emulator 10 may also be used as a low-cost, high speed ROM/EPROM emulator in other applications.

Although the present invention and its advantages have been described in detail, it should be understood that various changes, substitutions and alterations can be made herein without departing from the spirit and scope of the invention as defined by the appended claims.

What is claimed is:

1. A circuit for providing data to a processor and for receiving data from the processor, the circuit comprising:

an input path for receiving addresses and replacement data from the processor, the received data including processor control instructions;

first circuitry, coupled to the input path, for monitoring the addresses received from the processor and for detecting a predetermined sequence of addresses;

a bus;

second circuitry, coupled to the first circuitry and to the bus, for placing the replacement data on the bus in response to detection by the first circuitry of the predetermined sequence of addresses;

a second input path for receiving data; and third circuitry operable in response to receipt of data over the second input path for blocking all communication between the circuit and the processor for a period of time.

2. The circuit as recited in claim 1 wherein the input path is an address path for receiving the addresses and replacement data.

3. The circuit as recited in claim 1 wherein the first circuitry includes:

means for combining a plurality of processor read/write cycles to control addressing and placing of the replacement data on the bus.

4. The circuit as recited in claim 1 wherein a host processor is coupled to the circuit, and the first circuitry may further monitor commands from the host processor and allow the host processor to place data on the bus.

5. The circuit as recited in claim 1, further comprising:

a second input path for receiving data; and third circuitry operable in response to receipt of data over the second input path for blocking all communication between the circuit and the processor for a period of time.

6. The circuit as recited in claim 5, further comprising:

fourth circuitry for enabling placement on the bus of data received via the second input path.

7. The circuit as recited in claim 1 wherein the circuit is a ROM emulator.

8. The circuit as recited in claim 1 wherein the circuit further comprises:

a nonvolatile, read/write memory coupled to the bus and to the first circuitry to store data received via the replacement data.

9. The circuit as recited in 8 wherein the nonvolatile, read/write memory is an EEPROM.

10. The circuit as recited in claim 1 wherein the data includes BIOS software.

11. The circuit as recited in claim 1 wherein the predetermined addresses are a predetermined sequence of numerically non-sequential addresses.

12. A circuit for providing control instructions to a processor, the circuit being responsive to memory addresses and data from the processor, the circuit comprising:

an EEPROM for storing the data;

control circuitry for monitoring the memory addresses from the processor to detect a predetermined sequence of memory addresses;

an address buffer, coupled to the control circuitry, for storing the memory addresses and the data from the processor; and first circuitry, coupled to the control circuitry and the address buffer, under control of the control circuitry for enabling substitution of data stored within the EEPROM with the data in the address buffer from the processor in response to detection by the control circuitry of the predetermined sequence of memory addresses.

13. The circuit as recited in claim 12, further comprising:

second circuitry for enabling communication of the data from the processor over an addressing path between the processor and the EEPROM.

14. The circuit as recited in claim 12 wherein the circuit is a ROM emulator.

15. The circuit as recited in claim 12 wherein the data includes control instructions of BIOS software.

16. The circuit as recited in claim 12 wherein the predetermined sequence of memory addresses is a numerically non-sequential sequence of addresses.

17. A method for modifying processor control instructions in a read/write memory, the method comprising the steps of:

receiving instructions from an instruction source, the received instructions including new control instructions;

receiving addresses and new control instructions from a processor; monitoring the addresses received from the processor;

enabling, in response to receipt of a predetermined sequence of the monitored addresses, the substitution of specific control instructions for the processor in a read/write memory with new control instructions from the processor; and enabling, in response to receipt of the received instructions from the instruction source, the substitution of specific control instructions in the read/write memory with new control instructions from the instruction source.

18. The method as recited in claim 17 further comprising the step of:

sending control instructions from the read write memory to the processor over a data path; and wherein the step of receiving addresses and new control instructions from the processor comprises the step of:

receiving the new control instructions from the processor over an address path.

19. The method as recited in claim 18 further comprising the step of:

combining a plurality of read/write processor cycles to control addressing of each new control instruction and to control the step of enabling, in response to receipt of the predetermined sequence of the monitored addresses, the substitution of specific control instructions in the read/write memory with new control instructions from the processor.

20. The method as recited in claim 17, further comprising the step of:

blocking, in response to receipt of the instructions from the instruction source, all communication from the processor for a period of time.

21. The method as recited in claim 17 wherein the read/write memory is a non-volatile memory.

22. The method as recited in claim 21 wherein the non-volatile memory is an EEPROM.

23. The method as recited in claim 17 wherein the new control instructions include BIOS software.

24. The method as recited in claim 17 wherein the predetermined sequence of monitored addresses is a numerically non-sequential sequence of eight addresses.

25. A ROM emulator, comprising:

an addressable memory;

an address path coupled to the addressable memory for communicating address signals and data signals;

a latch coupled to the address path for storing data signals communicated on the address path;

a control circuit, coupled to the addressable memory, to the address path, and to the latch, for monitoring communications from a target processor on the address path, for transferring the data signals in the latch to the addressable memory after receiving a predetermined communication from the target processor, for monitoring communications from a host processor, and for permitting the host processor to write to the addressable memory to modify code in the memory;

a first interface for coupling the addressable memory and the control circuit to the target processor; and a second interface for coupling the addressable memory and the control circuit to the host processor.

26. The ROM emulator as recited in claim 25 wherein the addressable memory is a non-volatile memory.

27. The ROM emulator as recited in claim 25 wherein the first interface includes:

a header adapted for coupling the addressable memory to the ROM socket.

28. The ROM emulator as recited in claim 27 wherein the first interface includes:

address and data buffers coupled between the header and the addressable memory.

29. The ROM emulator as recited in claim 28 wherein the control circuit disables the address and data buffers to isolate the addressable memory from the target processor when the host processor writes to the addressable memory.

30. The ROM emulator as recited in claim 25 wherein the second interface includes:

a parallel interface for coupling the addressable memory to a parallel port of the host processor.

31. The ROM emulator as recited in claim 30 wherein the second interface includes:

address and data buffers coupled between the parallel interface and the addressable memory.

32. The ROM emulator as recited in claim 25 wherein the control circuit directs the addressable memory to receive write accesses from the target processor in response to control signals received from the target processor.

33. The ROM emulator as recited in claim 32 wherein the received control signals are a predetermined sequence of addresses of the addressable memory.

34. The ROM emulator as recited in claim 25 wherein the control circuit directs the addressable memory to receive write accesses from the host processor in response to control signals received from the host processor.

35. The ROM emulator as recited in claim 25 wherein the code is BIOS software.

36. The ROM emulator as recited in claim 25 wherein the ROM emulator is supplied power by a system coupled to the target processor.

37. A circuit for emulating a memory within a target computer system, said circuit comprising:

a means for storing code;

an address bus for coupling address and data signals from the target computer system to the storing means so that the target computer system may address memory locations within the storing means and provide data signals to the storing means;

means, coupled to the address bus, for latching data signals from the target computer system on the address bus;

means for coupling the storing means to an external computer system;

means, coupled to the target processor, for monitoring signals from the target computer system and for identifying a write command from data signals from the target computer system;

means, coupled to the address bus, for detecting a predetermined sequence of address signals from the target computer system;

means, coupled to the target computer system, for controlling read and write accesses to the storing means by the target computer system and the external computer system, wherein the means for controlling allows the target computer system to write data, latched in the means for latching, to the storing means after means for detecting detects the predetermined sequence of address signals from the target computer system and after identifying a write command from the target computer system write command;

means for coupling data signals from the storing means to the target computer system; and means for coupling data signals from the storing means to the external computer system.

38. The circuit as recited in claim 37 wherein the write accesses by the computer systems modify the ROM-based code.

39. The circuit as recited in claim 37 wherein the predetermined sequence of addresses are numerically non-sequential addresses.

40. The circuit as recited in claim 37 wherein the controlling means permits only read accesses from the target computer system to the storing means until a predetermined code is received from the external computer system.

41. The circuit as recited in claim 37 wherein the coupling means includes:

a header for coupling to a ROM socket within the target computer system; and address and data buffers coupled between the header and the storing means.

42. The circuit as recited in claim 37 wherein the means adapted for coupling the external computer system to the storing means includes:

a parallel interface for coupling to a parallel port on the external computer system; and address and data buffers coupled between the parallel interface and the storing means.

43. A method for modifying code stored within a read/write memory, the method comprising the steps of:

receiving signals via an address bus from a target system target processor coupled to the read/write memory;

monitoring the signals received from the target processor to detect memory control signals;

receiving memory control signals from a second processor coupled to the memory and external to the target system;

monitoring the control signals received from the second processor; and directing the memory to accept write accesses from the target processor when first predetermined control signals from the target processor are monitored, the write accesses modifying code stored within the read/write memory; and directing the memory to accept write accesses from the second processor when second predetermined control signals from the second processor are monitored, the write accesses modifying the code stored within the read/write memory.

44. The method as recited in claim 43 wherein the first predetermined control signals received from the target processor is formatted as a sequence of predetermined addresses.

45. The method as recited in claim 43 wherein the memory is directed to accept read accesses from the target processor during the monitoring steps until the second predetermined control signals are monitored.

46. The method as recited in claim 43 wherein the memory is an EEPROM.

47. The method as recited in claim 43 wherein the directing step further includes the step of:

isolating the memory from the target processor when the second predetermined control signals are received from the second processor.

48. The method as recited in claim 43 wherein the directing step includes the step of:

issuing a write enable command to the memory when the second predetermined control signals are received.

49. A method for developing code for a ROM within a target computer system, the method comprising the steps of:

storing a first version of the code in an EEPROM coupled to the target computer system;

permitting the EEPROM to accept read accesses from a target processor of the target computer system, the read accesses including address information;

sending a predetermined sequence of address signals from the target computer processor via an address bus to an address buffer;

sending control commands from the target computer processor via the address bus for the EEPROM to allow the EEPROM to accept write accesses detecting the predetermined sequence of address signals and control commands with a control circuit;

directing the EEPROM to accept write accesses from the target computer system when the predetermined sequence of address signals and control commands from the target computer system has been detected; and sending information from the target computer processor via the address bus to the EEPROM for writing to the EEPROM.

50. The method as recited in claim 49 wherein the write accesses results in a second version of the code.

51. The method as recited in claim 49 wherein the EEPROM is coupled to a socket that normally couples to the ROM.

52. The method as recited in claim 49, further comprising the steps of:

coupling the EEPROM to a computer system external to the target computer system;

sending control signals from the external computer system to the EEPROM; and directing the EEPROM to accept write accesses from the external computer system when a predetermined control signal is received from the external computer system.

53. The method as recited in claim 52, further comprising the step of:

isolating the EEPROM from the target computer system when the EEPROM is accepting write accesses from the external computer system.

54. A method for operating a ROM emulator coupled to a target computer system and an external computer system, the ROM emulator comprising an EEPROM having code stored therein, the method comprising the steps of:

operating the ROM emulator in an emulate mode, comprising the substeps of:

receiving address and command signals from the target computer system;

directing the EEPROM to accept read accesses from the target computer system; and monitoring address signals from the target computer system; and operating the ROM emulator in a target reprogram mode when a predetermined address communication is received, comprising the substeps of:

identifying the predetermined address communication received on an address path;

identifying predetermined signals on the address path as data signals;

identifying predetermined signals on the address path as write data command signals;

identifying predetermined signals on the address path as EEPROM address signals;

directing the EEPROM to accept write accesses from the target computer system; and storing the data signals in the EEPROM at the EEPROM address corresponding to the EEPROM address signals.

55. The method as recited in claim 54 wherein the operating in the target reprogram mode further comprises the substep of:

returning the ROM emulator to the emulate mode when a predetermined signal is received from the target computer system.

56. The method as recited in claim 54, further comprising the step of:

operating the ROM emulator in a parallel reprogram mode when a predetermined signal is received from the external computer system, comprising the substep of:

directing the EEPROM to accept write accesses from the external computer system.

57. The method as recited in claim 56 wherein the parallel reprogram mode further comprises the substep of:

isolating the EEPROM from the target computer system when the EEPROM is accepting write accesses from the external computer system.

58. The method as recited in claim 56 wherein the parallel reprogram mode further comprises the substep of:

returning the ROM emulator to the emulate mode when a predetermined signal is received from the external computer system.

59. The method as recited in claim 54 wherein the code is BIOS code.

60. A ROM emulator, comprising:

an EEPROM for storing BIOS code;

a control circuit coupled to the EEPROM;

a first interface for coupling the EEPROM and the control circuit to a target computer system, wherein the code is addressable by the target computer system via the first interface, wherein the first interface includes:

a header for coupling with a ROM socket within the target computer system; and address and data buffers coupled between the header and the EEPROM; and a second interface for coupling the EEPROM and the control circuit to a host computer system, wherein the second interface includes:

a parallel interface for coupling to a parallel port of the host computer system; and address latches and data buffers coupled between the parallel interface and the EEPROM;

wherein the control circuit permits the target computer system and the host computer system to write to the EEPROM to modify the BIOS code, wherein the control circuit disables the address and data buffers to isolate the EEPROM from the target computer system when the host computer system writes to the EEPROM, wherein the control circuit directs the EEPROM to receive write accesses from the target computer system in response to a predetermined sequence of addresses received from the target computer system, wherein the control circuit directs the EEPROM to receive write accesses from the host computer system in response to a control signal received from the host computer system, and wherein the ROM emulator is supplied power by the target computer system.

61. A method for operating a ROM emulator coupled to a target computer system and an external computer system, the ROM emulator comprising an EEPROM having code stored therein, the method comprising the steps of:

operating the ROM emulator in an emulate mode, comprising the substeps of:

directing the EEPROM to accept read accesses from the target computer system; and monitoring address signals from the target computer system; and operating the ROM emulator in a target reprogram mode when a predetermined sequence of the address signals is received, comprising the substep of:

directing the EEPROM to accept write accesses from the target computer system; and operating the ROM emulator in a parallel reprogram mode when a predetermined signal is received from the external computer system, comprising the substeps of:

directing the EEPROM to accept write accesses from the external computer system; and isolating the EEPROM from the target computer system when the EEPROM is accepting write accesses from the external computer system.

62. The method as recited in claim 61 wherein the operating in the target reprogram mode further comprises the substep of:

returning the ROM emulator to the emulate mode when a predetermined signal is received from the target computer system.

63. The method as recited in claim 61 wherein the code is BIOS code.

64. A method for operating a ROM emulator coupled to a target computer system and an external computer system, the ROM emulator comprising an EEPROM having code stored therein, the method comprising the steps of:

operating the ROM emulator in an emulate mode, comprising the substeps of:

directing the EEPROM to accept read accesses from the target computer system; and monitoring address signals from the target computer system; and operating the ROM emulator in a target reprogram mode when a predetermined sequence of the address signals is received, comprising the substep of:

directing the EEPROM to accept write accesses from the target computer system; and operating the ROM emulator in a parallel reprogram mode when a predetermined signal is received from the external computer system, comprising the substeps of:

directing the EEPROM to accept write accesses from the external computer system; and returning the ROM emulator to the emulate mode when a predetermined signal is received from the external computer system.

65. The method as recited in claim 64 wherein the operating in the target reprogram mode further comprises the substep of:

returning the ROM emulator to the emulate mode when a predetermined signal is received from the target computer system.

66. The method as recited in claim 64 wherein the code is BIOS code.

* * * * *